(12) United States Patent
Tham

(10) Patent No.: US 8,816,786 B2
(45) Date of Patent: Aug. 26, 2014

(54) METHOD AND APPARATUS OF A CRYSTAL OSCILLATOR WITH A NOISELESS AND AMPLITUDE BASED START UP CONTROL LOOP

(71) Applicant: Tensorcom, Inc., Carlsbad, CA (US)

(72) Inventor: KhongMeng Tham, San Diego, CA (US)

(73) Assignee: Tensorcom, Inc., Carlsbad, CA (US)

( * ) Notice: Subject to any disclaimer, the term of this patent is extended or adjusted under 35 U.S.C. 154(b) by 29 days.

(21) Appl. No.: 13/632,173

(22) Filed: Oct. 1, 2012

(65) Prior Publication Data

US 2014/0091869 A1 Apr. 3, 2014

(51) Int. Cl.
*H03L 5/00* (2006.01)
*H03B 5/36* (2006.01)

(52) U.S. Cl.
USPC ........... 331/109; 331/158; 331/160; 331/183; 331/186

(58) Field of Classification Search
USPC ..... 331/15, 109, 116 FE, 116 M, 116 R, 154, 331/158, 160, 182, 183, 185, 186
See application file for complete search history.

(56) References Cited

U.S. PATENT DOCUMENTS

| | | | |
|---|---|---|---|
| 6,278,338 B1 * | 8/2001 | Jansson | 331/116 FE |
| 6,556,094 B2 * | 4/2003 | Hasegawa et al. | 331/158 |
| 6,577,203 B2 * | 6/2003 | Fujii et al. | 331/158 |
| 7,009,460 B2 * | 3/2006 | Wilcox | 331/173 |
| 7,030,709 B2 * | 4/2006 | Novac | 331/158 |
| 7,123,109 B2 * | 10/2006 | Stevenson et al. | 331/109 |
| 7,123,113 B1 * | 10/2006 | Brennan et al. | 331/158 |
| 7,332,979 B2 | 2/2008 | Connell et al. | |
| 7,961,060 B1 * | 6/2011 | McMenamy et al. | 331/186 |
| 8,289,090 B2 * | 10/2012 | Chen et al. | 331/109 |
| 8,487,709 B2 * | 7/2013 | Ishikawa et al. | 331/160 |
| 8,618,889 B2 * | 12/2013 | Yoshida et al. | 331/158 |
| 2009/0072925 A1 | 3/2009 | Cathelin et al. | |
| 2011/0291767 A1 | 12/2011 | Ishikawa et al. | |
| 2012/0242419 A1 * | 9/2012 | Tsai et al. | 331/109 |
| 2012/0326794 A1 * | 12/2012 | Kammula | 331/15 |

FOREIGN PATENT DOCUMENTS

JP  2008-294904  12/2008
KR  10-0691369  3/2007

OTHER PUBLICATIONS

47 CFR § 15.257 Operation within the band 57—64 GHz, 2010.

(Continued)

*Primary Examiner* — Levi Gannon
(74) *Attorney, Agent, or Firm* — Thaddeus Gabara; Tyrean Patent Prosecution Law Firm

(57) ABSTRACT

A large gain is used to start up the oscillation of the crystal quickly. Once the oscillation starts, the amplitude is detected. A control circuit determines based on the measured amplitude to disable a low resistance path in the controlled switch array to reduce the applied gain below the power dissipation specification of the crystal. Another technique introduces a mixed-signal controlled power supply multi-path resistive array which tailors the maximum current to the crystal. A successive approximation register converts the amplitude into several partitions and enables/disables one of several power routing paths to the inverter of the oscillator. This allows a better match between the crystal selected by the customer and the on-chip drive circuitry to power up the oscillator without stressing the crystal. The "1/f" noise of the oscillator circuit is minimized by operating transistors in the triode region instead of the linear region.

18 Claims, 8 Drawing Sheets

(56) References Cited

OTHER PUBLICATIONS

"Analysis of I/f noise in CMOS APS" by H. Tian and E. Gamal, Proceedings of "Sensors and Camera Systems for Scientific, Industrial, and Digital Photography Applications", by Morley M. Blouke; Nitin Sampat; Nitin Sampat; Thomas Yeh; George M. Williams, Jr.; and Thomas Yeh, Editors, pp. 168-647, May 15, 2000.

"Basic Terminology for Quartz Crystal Resonators", Roditi International, p. 2-5, http://www.roditi.com/Crystal%20and%20Oscillator%20Products/pdfs/Basic-Terminology-for-Quartz-Crystal-Resonators.pdf, 2012.

"Detector (radio)" Wikipedia, http://en.wikipedia.org/wiki/Detector_(radio), 2012.

"Introduction to quartz crystals and natural quartz" U.S. Electronics, Inc., http://www.us-electronics.com/files/crystals.pdf, 2012.

Tutorial 726, "Specifying Quartz Crystals", Nov. 19, 2001, http://www.maximintegrated.com/app-notes/index.mvp/id/726.

"Pierce oscillator" Wikipedia, http://en.wikipedia.org/wiki/Pierce_oscillator, 2012.

"Successive approximation ADC" Wikipedia, http://en.wikipedia.org/wiki/Successive_approximation_ADC, 2012.

\* cited by examiner

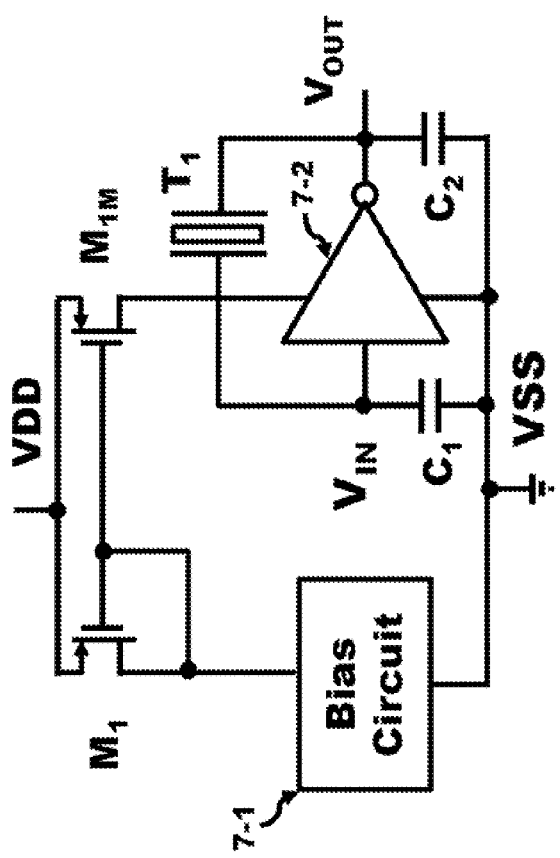
FIG. 7
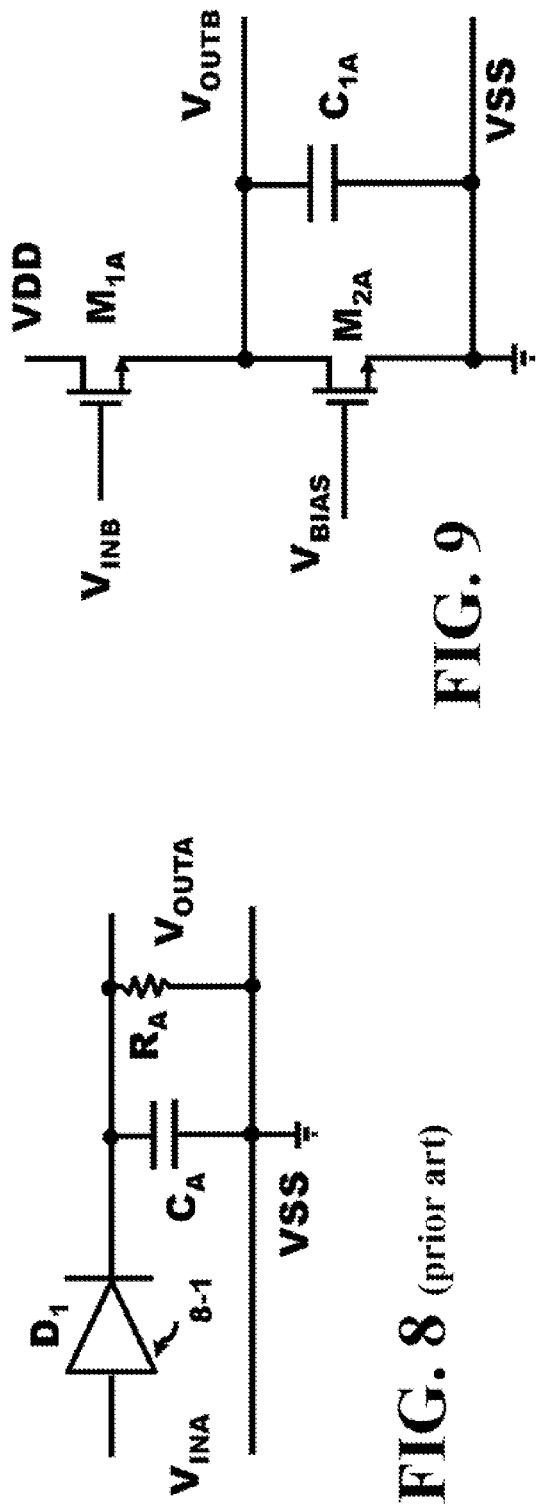
FIG. 9
FIG. 8 (prior art)

METHOD AND APPARATUS OF A CRYSTAL OSCILLATOR WITH A NOISELESS AND AMPLITUDE BASED START UP CONTROL LOOP

BACKGROUND OF THE INVENTION

The Federal Communications Commission (FCC) has allotted a spectrum of bandwidth in the 60 GHz frequency range (57 to 64 GHz). The Wireless Gigabit Alliance (WiGig) is targeting the standardization of this frequency band which will support data transmission rates up to 7 Gbps. Integrated circuits, formed in semiconductor die, offer high frequency operation in this millimeter wavelength range of frequencies. Some of these integrated circuits utilize Complementary Metal Oxide Semiconductor (CMOS), Silicon-Germanium (SiGe) or Gallium Arsenide (GaAs) technology to form the dice in these designs. Since WiGig transceivers use Digital to Analog Converters (DAC), the reduced power supply impacts the performance of the DAC's.

Complementary Metal Oxide Semiconductor (CMOS) is the primary technology used to construct integrated circuits. N-channel transistors and P-channel transistors (MOS transistor) are used in this technology which uses fine line technology to consistently reduce the channel length of the MOS transistors. Some of the current values for this technology include the channel length being 40 nm, the power supply of VDD equaling 1.2 V and the number of layers of metal levels being 8 or more. This technology typically scales with technology.

CMOS technology delivers a designer the ability to form a very large system level design on one die which is known as a System On a Chip (SOC). The SOC is a complex system with millions, if not billions, of transistors which contain analog circuits and digital circuits. The analog circuits operate purely analog, the digital circuits operate purely digital and these two circuits types can be combined together to form circuits operating in a mixed-signal mode.

For example, digital circuits in their basic form only use digital logic and some examples can be a component comprising at least one; processor, memory, control logic, digital I/O circuit, reconfigurable logic and/or hardware programmed that to operate as hardware emulator. Analog circuits in their basic form use only analog circuits and some examples can be a component comprising at least one; amplifier, oscillator, mixer, and/or filter. Mixed signal in their basic form only use both digital and analog circuits and some examples can be a component comprising at least one: Digital to Analog Converter (DAC), Analog to Digital Converter (ADC), Programmable Gain Amplifier (PGA), Power Supply control, Phase Lock Loop (PLL), and/or transistor behavior control over Process, Voltage and Temperature (PVT). The combination of digital logic components with analog circuit components can appear to behave like mixed signal circuits; furthermore, the examples that have been provided are not exhaustive as one knowledgeable in the arts understands. The PLL use a frequency reference that is typically derived from a crystal oscillator.

One of the critical design parameters of an electrical system is the generation of a stable and reliable oscillator. Quartz crystals oscillate under the influence of an electric field or can generate electric fields if exposed to stress. The quartz crystal, also called a crystal for short, can shaped into various sizes and thicknesses to achieve a myriad of resonant frequency behavior up to a fundamental frequency of about 30 MHz. As the crystal becomes thinner, the fundamental frequency goes higher. Higher order overtones above 30 MHz are also possible. Since the mechanical structure of the crystal oscillates, an electrical model of a tank circuit for the physical system can be determined. The electrical model is illustrated in FIG. 1. The mechanical mass of the crystal can be modeled by an inductance $L_c$, the stiffness of the crystal by a capacitance $C_c$ and the heat loss by a resistance $R_c$. The shunt capacitance $C_{SH}$ is the capacitance that the crystal presents when it is not oscillating. Quartz crystals have superb frequency characteristics that allow these devices to be used in systems to track time. They provide a very stable clock for use in an integrated circuit.

One of the critical parameters in a crystal oscillator is the Equivalent Series Resistance (ESR). When the crystal oscillates at the fundamental frequency, the reactance of the inductance $L_C$ equals the absolute value of the reactance of the capacitance $C_C$. When these two reactances are added together, they leave a net sum of zero. However, at this frequency, $R_C$ equals to ESR. The value of ESR can vary over a magnitude of order from crystals which operate at the same frequency. In a wireless system, the ESR of the crystal can range from 10 ohms to 150 ohms. Typically, a lower value of ESR implies that the crystal will have a higher cost because of the lower loss. The variations of this large range of ESR presents a problem in the design of the startup and biasing circuit to operate the crystal. If the value is too large, the crystal may not oscillate. If the value is too small, the circuit may exceed the drive level of the crystal and damage the crystal.

This drive level is an important criterion that the circuit must meet but not exceed in order to insure that the crystal is not damaged. The excessive drive level can cause the crystal to shift in frequency behavior, the device to age faster than expected, or worst yet, the device to over stress which results in the physical failure of the crystal. If the drive level is too small, the crystal may not oscillate at all. Currently, the approach to address these problems is to 1) design a family of circuits each designed to drive one of the limited range of drive levels forcing the chipmaker to offer several versions of their product which effectively increases their costs; or 2) design only one circuit and force the customer to buy a particular crystal with the specified drive range with the potential prospect of losing customers. An innovative technique will be described which overcomes both of these problems.

A crystal oscillator using Pierce configuration is a very common circuit design. The Pierce circuit only requires one inverter gain stage. The frequency spectrum at the output of an oscillator ideally should produce an oscillation only at the fundamental frequency. However, due to noise, the waveform at the output of the oscillator exhibits a frequency offset or spread of frequencies surrounding the fundamental frequency. One of the components of this noise causing the spread is called "1/f" noise or flicker noise. In any design of oscillators, the minimization of 1/f noise is required to improve the system specifications. In the design of the crystal oscillator, another innovative technique is used to reduce the 1/f noise.

BRIEF SUMMARY OF THE INVENTION

To be versatile, the crystal oscillator needs to be compatible with many different types of crystals from various manufactures who attempt to meet the specifications for portable applications. The effect of this wide range of ESR is that the (inverter) gain of the crystal oscillator needs to be large enough to get the oscillation started. A large gain will start the oscillation quickly, while a low gain will have long start up time. For one target application, the oscillation should start in under 200 µs. Using a large gain inverter will satisfy this requirement, however, when the inverter gain is large, the signal power into the crystal is also large. Since the crystal is a mechanical system where the oscillation is due to the vibration of the crystal, the crystal can be overdriven into vibrations as the crystal attempts to keep up with the external stimulus and thereby suffers a mechanical breakdown and potentially could fail. The manufacturer's specification of the crystal provides limits on the amount of power that can be applied into the crystal. These specifications must be followed in order for the crystal to operate reliably.

In accordance with one aspect of the invention, a control loop is used to provide a large gain to start up the oscillation of the crystal quickly. Once the oscillation starts, the amplitude is detected. A control circuit determines based on the measured amplitude if a switch needs to be disabled to limit the applied gain below the power dissipation specification of the crystal. After the oscillator has been started, the oscillator then moves into the steady state mode. The control loop completely disconnects the amplitude detector, the control circuit and disables the bias circuit so these components become detached from the oscillator making these components "noiseless" with respect to the oscillator. Thus, after startup, these components and do not impact the steady state phase noise performance of the crystal.

Another illustrative embodiment introduces a mixed-signal controlled power supply multi-path resistive array which tailors the maximum current to the crystal. A successive approximation ADC is inserted between the amplitude detector and the multi-path resistive array. The successive approximation ADC converts the amplitude into several partitions and enables/disables one of several power routing paths to the inverter of the oscillator. This allows a better match between the crystal selected by the customer and the on-chip drive circuitry to power up the oscillator without stressing the crystal.

In another illustrative embodiment, the "1/f" noise of the oscillator circuit is minimized by carefully optimized for many performance criteria, including insuring that the inverter has enough gain to provide start up, but not too much to consume too much power. These transistors are optimized in size for 1/f and thermal phase noise etc.

Another illustrative embodiment comprises a crystal oscillator apparatus with a crystal oscillator powered through a controlled switch array, an output of the crystal oscillator coupled by a transmission gate to a first amplitude detector, a first input of a control logic coupled to an output of the first amplitude detector and at least one output of the control logic coupled to the controlled switch array. The apparatus also comprises at least one output of the control logic coupled to the transmission gate. The controlled switch array comprises a first resistor in parallel with a series combination of a second resistor and a transistor or a first resistor in parallel with at least one combination of another resistor in series with a transistor. The crystal oscillator comprises a first node of a crystal coupled to an input of an inverter, a second node of the crystal coupled to an output of the inverter, a first capacitor coupled to the first node of the crystal, a second capacitor coupled to the second node of the crystal and a power lead of the inverter coupled to the controlled switch array. An output of a resistor string is coupled to an input of a second amplitude detector and an output of the second amplitude detector is coupled to a second input of the control logic. A first digital signal couples a tap point of the resistor string to the output of the resistor string. The first amplitude detector and the second amplitude detector are substantially similar in configuration and dimensions.

Another illustrative embodiment comprises an apparatus with a crystal oscillator powered through a controlled switch array, an output of the crystal oscillator coupled by a transmission gate to a first amplitude detector, a first input of a comparator coupled to an output of the first amplitude detector, an output of the comparator coupled to a successive approximation register (SAR) and a plurality of digital outputs of the SAR coupled to the controlled switch array. At least one output of the SAR is coupled to a gate of the transmission gate. The controlled switch array comprises a first resistor in parallel with at least one combination of another resistor in series with a transistor. An output of a resistor string is coupled to an input of a second amplitude detector and an output of the second amplitude detector is coupled to a second input of the comparator. A first digital signal couples a tap point of the resistor string to the output of the resistor string.

Lastly, another illustrative embodiment includes a method of minimizing 1/f noise in a crystal oscillator comprising the steps of powering the crystal oscillator through a controlled switch array, forming the controlled switch array with a first resistor in parallel with at least one combination of another resistor in series with a transistor, coupling an output of the crystal oscillator to a first amplitude detector, coupling a first input of a control logic to an output of the first amplitude detector, detecting when the first input of the control logic is greater than a reference voltage, coupling at least one output of the control logic to the controlled switch array, adjusting network of the controlled switch array, supplying a reduced current to the crystal oscillator with the adjusted network and thereby minimizing the 1/f noise in the crystal oscillator. The method further comprises coupling a transmission gate between the crystal oscillator and the first amplitude detector, disabling the transmission gate with an output of the control logic, isolating first amplitude detector from the output of crystal oscillator, coupling an output of a resistor string to an input of a second amplitude detector, generating the reference voltage at an output of the second amplitude detector and selecting a tap point voltage of the resistor string.

BRIEF DESCRIPTION OF THE DRAWINGS

Please note that the drawings shown in this specification may not necessarily be drawn to scale and the relative dimensions of various elements in the diagrams are depicted schematically. The inventions presented here may be embodied in many different forms and should not be construed as limited to the embodiments set forth herein. Rather, these embodiments are provided so that this disclosure will be thorough and complete, and will fully convey the scope of the invention to those skilled in the art. In other instances, well-known structures and functions have not been shown or described in detail to avoid unnecessarily obscuring the description of the embodiment of the invention. Like numbers refer to like elements in the diagrams.

FIG. 7 depicts a bias circuit and current mirror providing a controlled current to a Pierce oscillator in accordance with the present invention.

FIG. 8 presents an amplitude detector circuit.

FIG. 9 illustrates an amplitude detector designed in CMOS in accordance with the present invention.

DETAILED DESCRIPTION OF THE INVENTION

This invention has been incorporated into the transceiver design for a 60 GHz wireless system. The inventive apparatus is applicable to any high frequency system, for example, where the operational frequency is derived from a crystal oscillator. This invention improves the noise characteristics of a crystal oscillator and increases the lifetime of the crystal.

Figure 1:
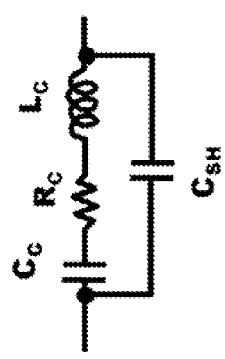
FIG. 1 depicts an equivalent circuit of a crystal oscillator.
Figure 2:
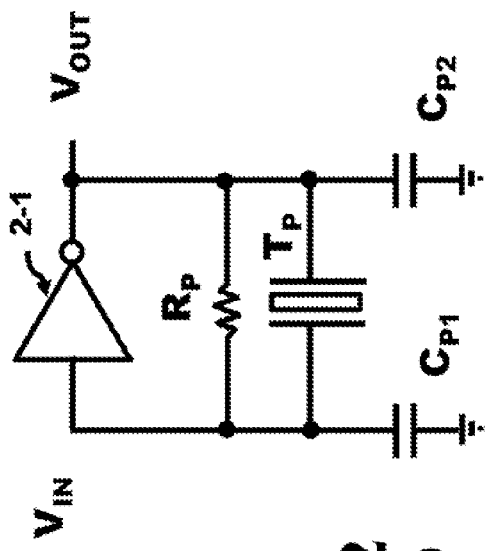
FIG. 2 shows a Pierce oscillator with a single inverter.

A crystal oscillator called a Pierce oscillator is depicted in FIG. 2 which uses a minimum of additional parts in conjunction with the crystal $T_P$. The circuit uses the additional parts of two capacitors, $C_{P1}$ and $C_{P2}$, an inverter 2-1 and the large impedance of $R_P$. The impedance $R_P$ coupled between the input and output nodes of the inverter initializes the DC voltages at these two nodes to equal one another and form a high gain system with the inverter 2-1. The crystal $T_P$ coupled between these nodes is sensitive to any noise developed in the system and behaves as very selective filter to pass only those frequencies corresponding to the fundamental frequency of the crystal. These frequencies excite the Pierce oscillator into oscillation and generate oscillations at nodes $V_{IN}$ and $V_{OUT}$. The capacitors $C_{P1}$ coupled to the input node and $C_{P2}$ coupled to the output node are designed to have a desired capacitance to reach the target frequency of oscillation for the Pierce oscillator but may be comprised of discrete capacitors as well as parasitic capacitance. The selective filter ability of the crystal maintains the frequency of oscillation within a very tight tolerance allowing the oscillation to be used for accurate clocking of a system.

Figure 3:
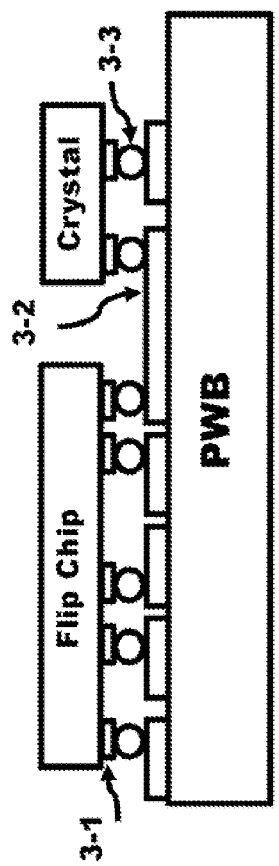
FIG. 3 presents a cross sectional view of a system with a chip couple to a crystal via soldered bumps on a PWB in accordance with the present invention.

The inverter 2-1 and the crystal $T_P$ are typically constructed of different materials on different substrates. These two devices usually require separate packing or encapsulation techniques are then connected externally between their packages to each other. The bonding pads on the substrate, the bonding wire or solder bumps, and an interconnect environment, such a printed wired circuit board (PWB), interconnects these two devices together. One example of interconnecting an integrated circuit to a crystal is depicted in FIG. 3. The integrated circuit is the flip chip with metalized pads 3-1 coupled via solder bumps 3-3 to the metalized pads and traces on a PWB. The integrated circuit contains a multitude of circuits including the inverter. The PWB provides support and interconnectivity 3-2 between various solder bumped components. The trace length between the flip chip and the two pads of the crystal are equalized to equalize the parasitic capacitive components of $C_{P1}$ and $C_{P2}$. The capacitance includes the capacitance of the bonding pad, solder bump, of the interconnect PWB capacitance and a tuning capacitance, if used.

Figure 4:
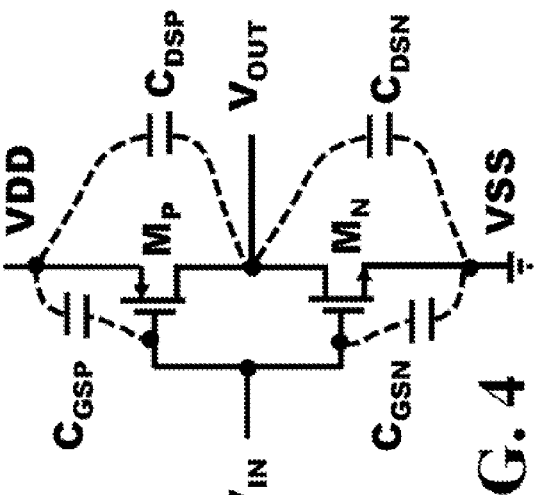
FIG. 4 illustrates the parasitic capacitances of a CMOS inverter in accordance with the present invention.

The transistors schematic of the inverter is shown in FIG. 4 and comprises a P-channel transistor, $M_P$, over an N-channel transistor, $M_N$, coupled between the power supplies VDD and VSS. The inverter is a conventional structure of P over N-channel. However, the widths and lengths of these transistors are carefully optimized to achieve several performance criteria, including a sufficient gain to provide start up, but not an excessive gain which would consume significant power. In addition, the inverter is optimized in size to minimize 1/f and thermal phase noise. The capacitances $C_{P1}$ and $C_{P2}$ in FIG. 2 are lumped equivalent for all the previous mentioned capacitance as well as the parasitic capacitances of the transistors. For example, in FIG. 4, these are the gate to source capacitors $C_{GSP}$ and $C_{GSN}$, and the drain to source capacitors $C_{DSP}$ and $C_{DSN}$.

In the "Analysis of 1/f noise in CMOS APS" by H. Tian and E. Gamal in published in Proceedings of "Sensors and Camera Systems for Scientific, Industrial, and Digital Photography Applications", by Morley M. Blouke; Nitin Sampat; Nitin Sampat; Thomas Yeh; George M. Williams, Jr.; and Thomas Yeh, Editors, pp. 168-647 on 15 May 2000 with an ISBN of 9780819435835, the equation (1) provides the drain current 1/f noise power spectral density (psd) is given by SVg(f) which is the equivalent gate voltage 1/f noise psd.:

$$S_{V_g}(f) = \frac{k_f}{2C_{ox}Af} \tag{1}$$

where $$k_f = \frac{q^2 k T N_t}{C_{oxY}} \tag{2}$$

and the $C_{ox}$ is the gate oxide capacitance, A is the area of the MOS transistor, A=(W)(L) where W is the channel width and L is the channel length, f is the frequency and $k_f$ is defined in equation (2). From equation (1), for low 1/f noise, the area, A, needs to be large. However, for a large width MOS transistor, the power consumption of the crystal oscillator circuit is also large. Thus, a careful analysis is required to determine the appropriate area to minimize the noise versus the allowable power dissipation of the crystal oscillator. This criterion is applied to the inverter presented in FIG. 4 to determine the channels width and channel length of the transistors $M_P$ and $M_N$. Once the optimum width and lengths have been determined, this inverter design is used in the remainder of the circuits presented in this document.

Figure 5:
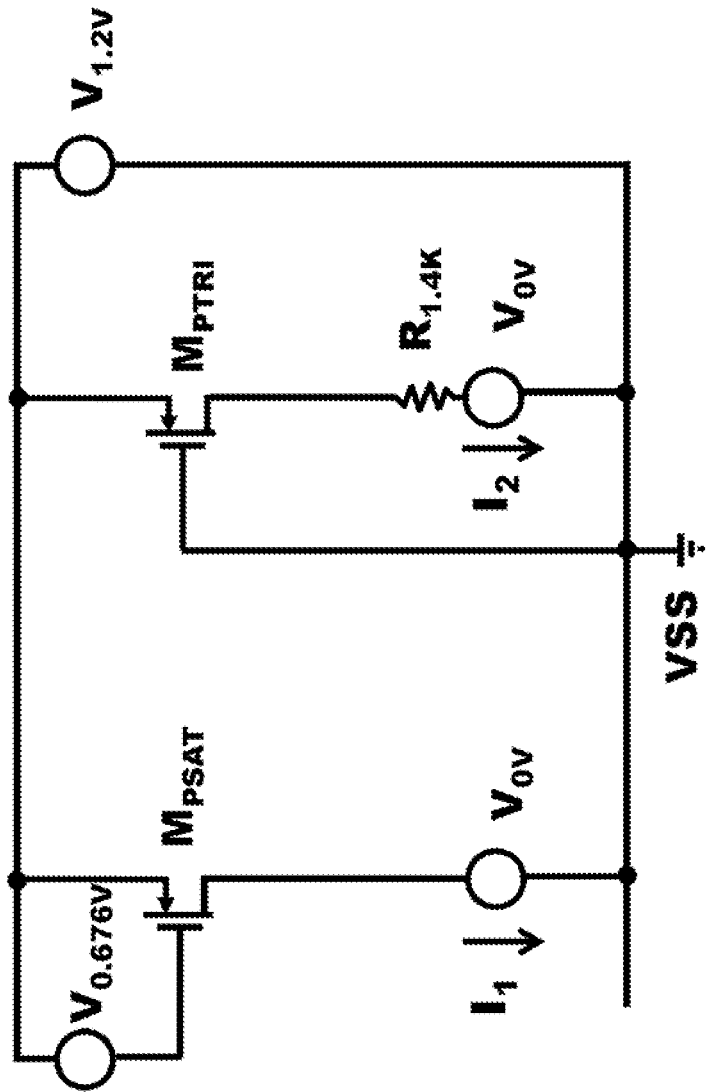
FIG. 5 shows a test circuit used to measure 1/f noise in accordance with the present invention.

FIG. 5 illustrates the test circuit which was utilized to perform the 1/f noise measurements. The transistor widths and lengths of the two transistors $M_{PSAT}$ and $M_{PTRI}$ are identical. A current of 0.784 mA flows in each volt voltage source ($V_{0V}$) through the corresponding transistor. The P-channel transistor $M_{PSAT}$ is configured to behave in the saturation mode. The full voltage of VDD equaling 1.2 V is applied across its drain-source terminals. The gate to source voltage is set at 0.676 V. The second P-channel transistor $M_{PTRI}$ is configured to behave in the linear or triode mode. The gate to source voltage is VDD and the source to drain voltage operates in the linear or triode mode. The resistance $R_{1.4K}$ prevents the full VDD from being applied across the source to drain terminals. These two transistors were tested for 1/f noise.

Figure 6:
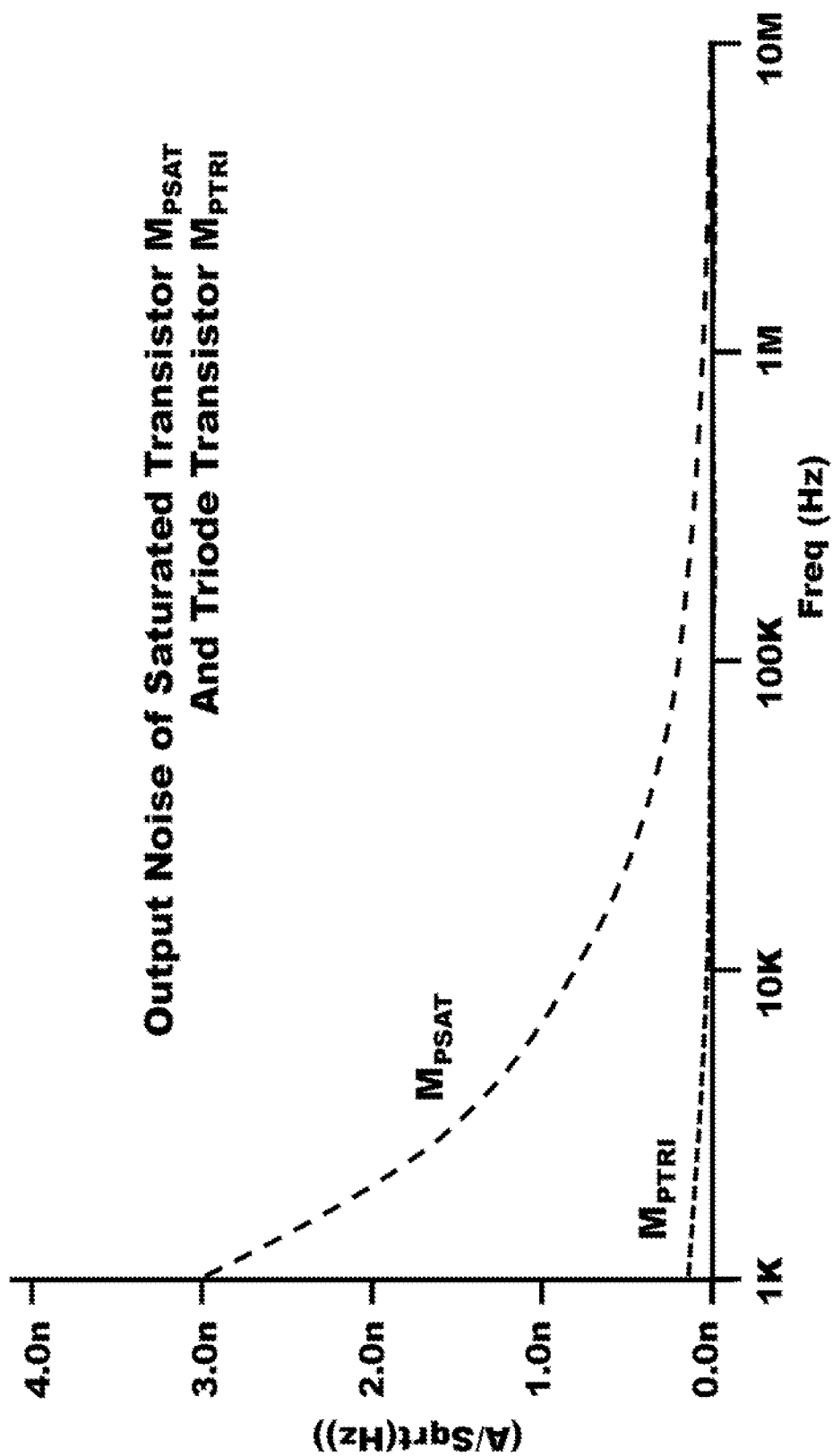
FIG. 6 illustrates the measured results of 1/f noise of the test circuit in FIG. 5 in accordance with the present invention.

The measured 1/f noise results for the transistors in saturation and the linear modes are presented in the FIG. 6. The horizontal axis is given in log of Frequency ranging from 1 KHz to 10 MHz. The vertical axis is in A/Sqrt (Hz) ranging from 0 to 4E-9. A dramatic difference is noted in the 1/f noise of the transistor in saturation $M_{PSAT}$ versus that of the transistor $M_{PTRI}$ in the linear or triode mode. If transistors which are in the saturation mode in a given circuit can be replaced by transistors that operate in the triode or linear mode, then a significant improvement in minimizing the 1/f noise can be achieved.

If a CMOS inverter as illustrated in FIG. 4 is used in the inverter circuit 2-1 in FIG. 2, then the current is uncontrolled and the peak power delivered to the crystal $T_P$ may exceed the requirements in the specification. A controlled current is required to keep the peak power within a desired range. As presented in FIG. 7, a common practice is to limit the current through an inverter 7-2 using a bias current source 7-1. The crystal $T_1$ and capacitors $C_1$ and $C_2$ are selected to achieve the desired frequency after accounting for all interconnecting parasitics (capacitive and inductive) between the crystal and the chip that carries the invertor 7-2. The current is applied to the mirror source $M_1$ and mirrored in transistor $M_{1M}$. The mirrored current controlled by the bias circuit 7-1 supplies current through the power lead to the crystal oscillator and can be set to avoid overdriving the crystal. However, the transistors $M_1$ and $M_{1M}$ are both in the saturation mode. Thus, the noise from the bias circuit 7-1, and the transistors noise of $M_1$ and $M_{1M}$ are injected by this current into the VDD power supply node of the inverter 7-2. This current introduces an additional degradation of phase noise in the output of the crystal oscillator, $V_{OUT}$. If these saturated transistors could be replaced with transistors operating in the triode mode, a significant reduction in 1/f noise can occur.

An implementation of amplitude/envelope detector is provided in FIG. 8. A diode D1 is in series with the parallel combination a capacitor $C_A$ and resistor $R_A$. The input signal $V_{INA}$ is applied to the anode of $D_1$ and the output signal is extracted across the parallel combination of the resistor-capacitor. The diode $D_1$ 8-1 only allows a forward conduction from $V_{INA}$ to $V_{OUTA}$. Whenever $V_{INA}$ is greater than $V_{OUTA}$ by diode threshold, the diode conducts and charges the capacitance $C_A$. If the input waveform applied at $V_{INA}$ is oscillating, the voltage components of the waveform greater than $V_{OUTA}$ plus a diode threshold charge up the capacitor $C_A$. The resistor $R_A$ has a very large impedance allowing the voltage across CA to follow the input. This type of detector is used in an amplitude modulation (AM) radio which demodulates the signal from the carrier wave.

The amplitude/envelope detector designed in CMOS is shown in FIG. 9. An N-channel stack comprising two transistors, $M_{1A}$ and $M_{2A}$, is coupled between VDD and VSS and the source of $M_{1A}$ and drain of $M_{1B}$ are coupled to a capacitor $C_{1A}$. The transistor $M_{2A}$ is biased by a voltage $V_{BIAS}$. The input signal is applied to the gate of transistor $M_{1A}$. The output signal is across the capacitor $C_{1A}$. A current source biases the transistors $M_{2A}$ at a very low current level (<1 uA) and behaves like the large value resistor $R_A$ in FIG. 8. Since $M_{2A}$ is biased at a very low current level, the input signal $V_{INB}$ is provided by the output from the crystal oscillator amplifier. The oscillator swings positive and negative with respect to its common-mode (or mean/average value), where the positive swing on $V_{INB}$ greater than the threshold of $M_{1A}$ causes the transistor $M_{1A}$ to conduct its $I_{ds}$ current to charge the capacitor $C_{1A}$. On the negative swing, $M_{1A}$ is in the OFF region. Hence, $M_{1A}$ behaves like the diode as shown in the FIG. 8.

Figure 10:
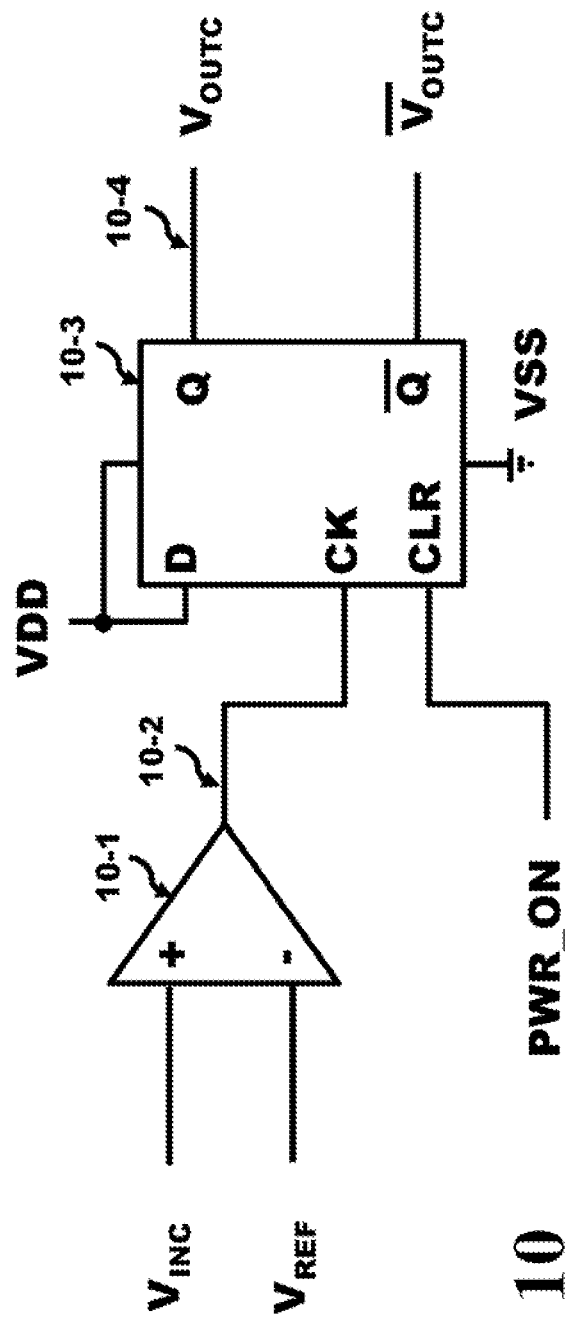
FIG. 10 shows the control logic used to latch a control signal in accordance with the present invention.

An illustration of the control logic is shown in FIG. 10. When the circuit is first powered up (PWR_ON=1), the Q output or $V_{OUTC}$ 10-4 of the D-FF 10-3 is initialized to a "0." $V_{REF}$ is a reference voltage that can be generated by a string of resistors with taps between the resistors, which is compared against the rectified output of the crystal oscillator output swing. For example, if the desired crystal oscillator output swing is 1.0V, then $V_{REF}$ is set to 1.0V. As the voltage of the oscillator builds up in voltage magnitude and exceeds 1.0V, the comparator 10-1 detects the difference. The input to this comparator $V_{INC}$ is from the output from the amplitude/ envelope detector circuit shown in FIG. 9. Hence, $V_{INC}$ represents the amplitude value of the crystal oscillator swing. When this amplitude $V_{INC}$ is larger than the amplitude reference level $V_{REF}$, the output of the comparator 10-1 becomes "1". This generates a clock signal CK into the D-FF 10-3, which clocks the D-FF 10-3 output "Q" or $V_{OUTC}$ 10-4 to a "1" state. The value of $V_{OUTC}$ is used as a feedback signal to reconfigure the network.

Figure 11:
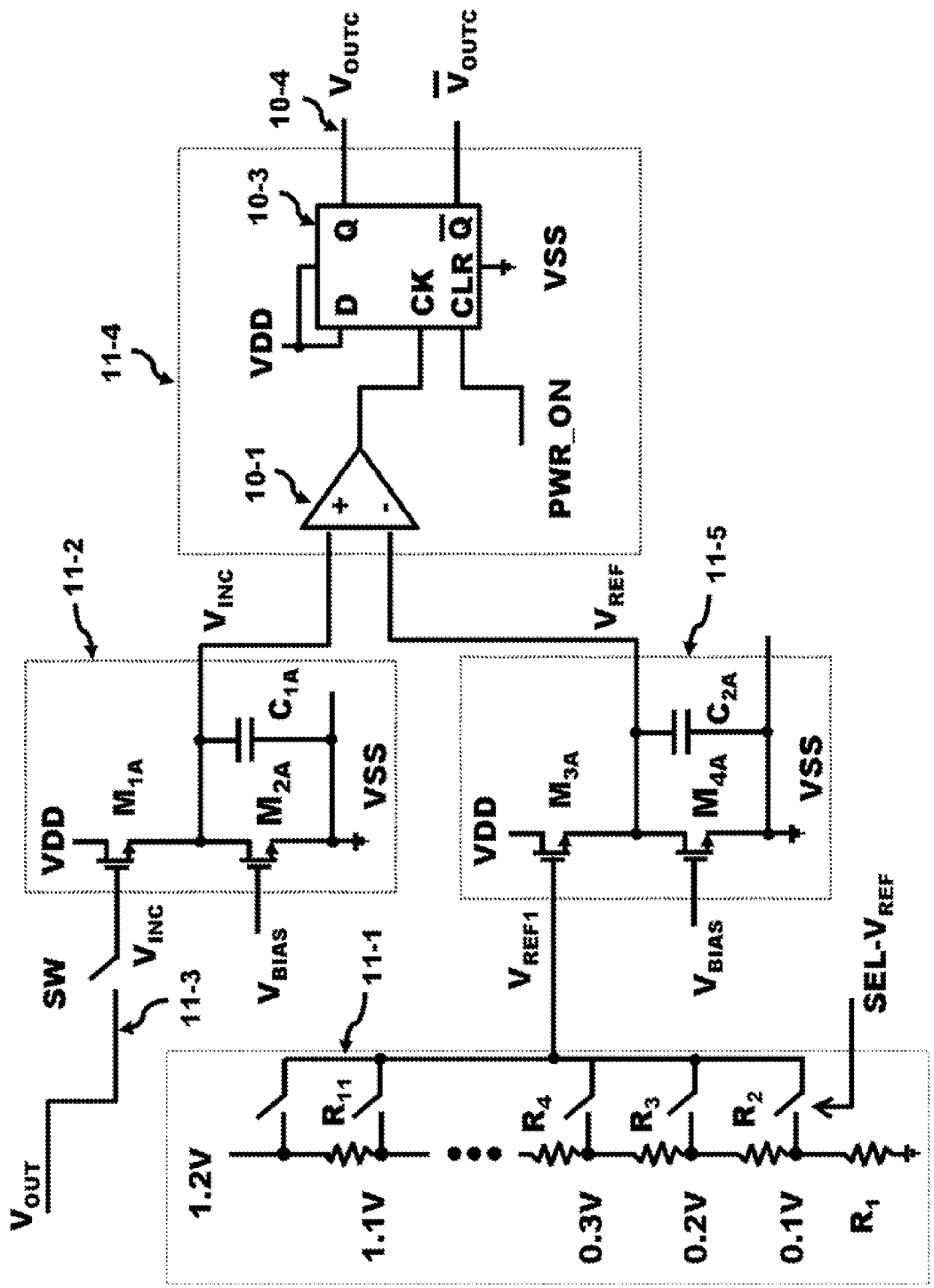
FIG. 11 shows a way of adjusting the power supply current to a crystal oscillator using an amplitude detector in accordance with the present invention.

FIG. 11 illustrates how the resistor string 11-1 and the output of the oscillator 11-3 interface to their amplitude detectors 11-5 and 11-2, respectively. The amplitude detectors 11-5 and 11-2 are substantially similar in configuration and dimensions. The $V_{BIAS}$ is shared between the two detectors allowing the output to have a similar response to equivalent input signals. The resistor string 11-1 consists of 11 resistors ($R_1$-$R_{11}$) between VDD and VSS where VDD is 1.2 V and VSS is set to a ground potential. Each of the resistors are equal in value producing voltages of equal steps of 0.1 V, 0.2 V, 0.3 V and voltages all the way up to 1.2 V. A SEL-$V_{REF}$ digital signal determined by the user enables one of the switches which connect one of the tap points of the resistor string to $V_{REF1}$. This DC voltage is applied to the amplitude detector 11-5 to generate the voltage $V_{REF}$ at the output of 11-5.

Concurrently, the oscillator signal is applied at $V_{OUT}$ 11-3. During startup, the transmission gate SW is enabled. The transmission gate comprises a P-channel transistor in parallel with an N-channel transistor and is enabled when a "0" (VSS) is applied to the gate of the P-channel transistor and a "1" (VDD) is applied to the gate of the N-channel transistor. The oscillatory signal at 11-3 from the crystal oscillator passes to the input of the amplitude detector 11-2. This amplitude detector 11-2 is identical to the amplitude detector within the dotted box 11-5. The amplitude detector 11-2 rectifies the oscillatory signal at the output node $V_{INC}$. Both of the outputs of these amplitude detectors are applied to the control logic 11-4. Once inside of the control logic, these inputs are applied to the inputs of the comparator 10-1. The comparator 10-1 compares the amplitude of the rectified signal from the crystal oscillator against the reference DC value from the resistor string. Once the reference oscillator output $V_{INC}$ is greater than that of the resistor string $V_{REF}$, the operational amplifier 10-1 generates a "1" that is applied to the clock input of the flip-flop 10-3. The "1" applied to the clock input overwrites the previously value of "0" that $V_{OUTC}$ 10-4 was initialized to at startup. Once $V_{OUTC}$ changes to a "1," this signal is feedback to several locations to disabled several components. The disabled components then reconfigure the network of the crystal oscillator to minimize the 1/f noise and adjust the power to the crystal.

Figure 12:
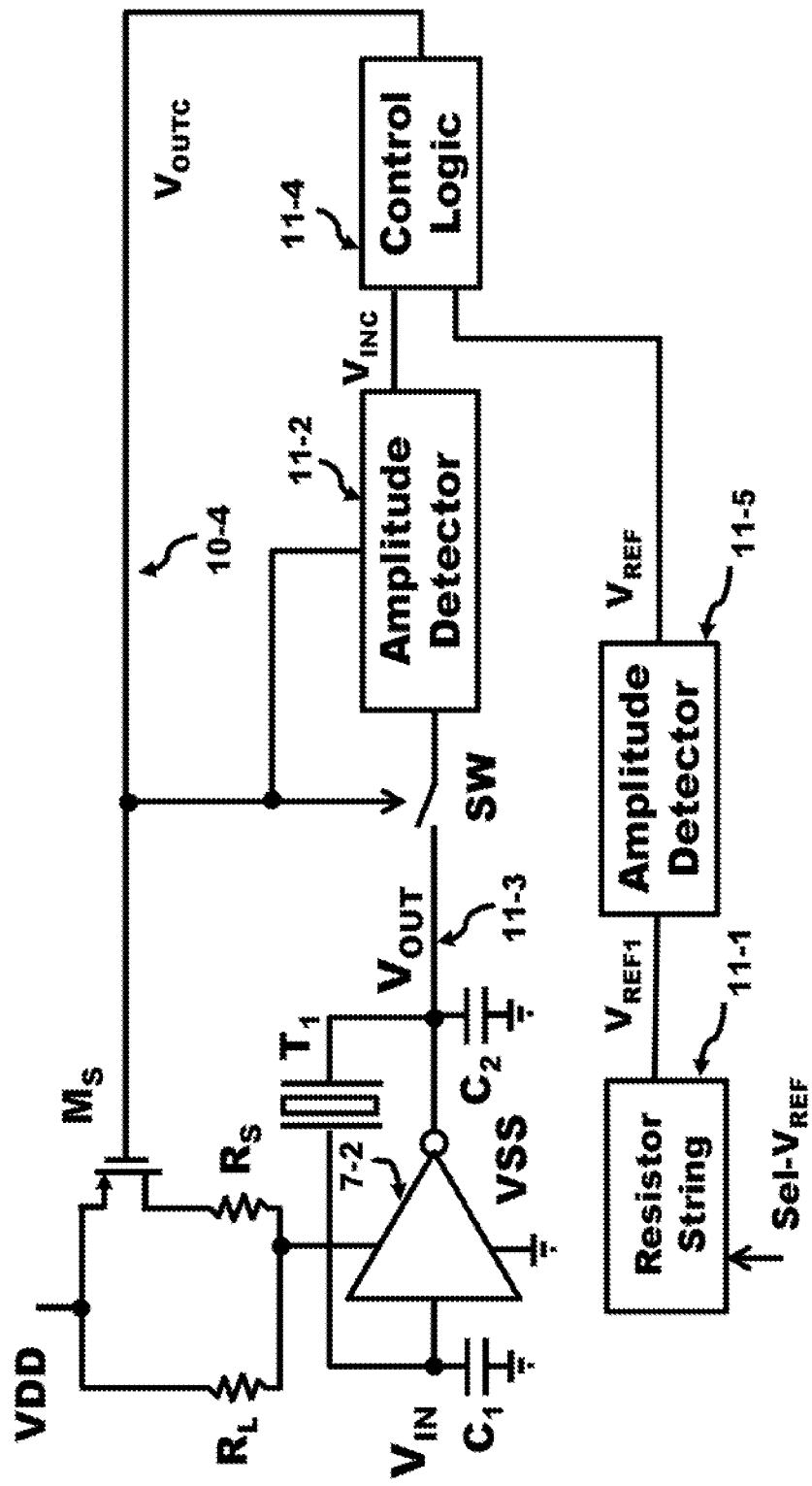
FIG. 12 presents a detailed circuit applying the voltages to the control circuit in accordance with the present invention.

When the output $V_{OUTC}$ 10-4 of the control logic 11-4 is initialized to a "0," the P-channel MOS transistor $M_S$ and the transmission gate SW in FIG. 12 are enabled in the ON state. The resistor string 11-1 is set by the user to determine the tap point of the resistor string by the digital signal SEL-$V_{REF}$. The amplitude detector 11-5, identical to the one in 11-2, generates a voltage VREF and compares this voltage against VINC in the control logic 11-4.

This innovative technique removes the need for a bias circuit and current mirrors by accordingly measuring, adjusting directly the power applied to the crystal and disconnecting the monitoring circuit. The crystal oscillator is identical as in FIG. 7 where the inverter 7-2 is coupled to the crystal $T_1$ and the two capacitors $C_1$ and $C_2$. When the crystal oscillator is initially powered up, the output transmission gate SW is enabled and couples the voltage $V_{OUT}$ to the amplitude detector 11-2. Since the P-channel MOS transistor $M_S$ is enabled, the inverter gain of the crystal oscillator is biased with a large value resistor $R_L$ in parallel with the combination of a small value resistor $R_S$ in series with transistor $M_S$. The overall resistance of the parallel combination provides a small resistance and therefore a large bias current is channeled into the inverter 7-2. Hence, the inverter is in high gain state and the crystal oscillator starts up very quick (under 200 µs). However, the power applied to the crystal may become excessive and cause damage. The power must be reduced to a safe level before damage to the crystal occurs.

The current innovation reduces the current drive as shown in FIG. 12. The amplitude detector 11-2 and control logic 11-4 perform this function of reducing the power to a safe level. The output of the inverter amplifier is connected through the enabled transmission gate SW to an amplitude detector circuit. When the crystal oscillator is started up, the amplitude detector 11-2 measures the power applied to the crystal. If the measured power is excessive, a signal is applied to the control logic 11-4. The comparator within the control logic 11-4 detects the magnitude of the large power causing $V_{OUTC}$ 10-4 to change to a "1." The controlled switch array of the resistor $R_L$ and the series combination of the transistor $M_S$ and $R_S$ controls the current flow to the crystal oscillator. The control logic then disables the P-channel MOS transistor $M_S$ thereby removing the small value of resistance $R_S$ from the parallel combination of $R_L$, and $R_S$. The remaining resistor $R_L$ provides current a limiting bias to the inverter 7-2. This decreases the operating current into the inverter 7-2 and ensures that the crystal maximum power dissipation specification is not exceeded.

Note that the bias circuit 7-1 and the current mirrors $M_1$ and $M_{1M}$ of FIG. 7 have been replaced by the controlled switch array of the large value resistor in parallel with the combination of the small value resistor in series with the transistor $M_S$. Furthermore, the transistor is enabled in the triode mode instead of the saturated mode, thereby reducing the 1/f noise when the controlled switch array is fully enabled. The innovative aspect of this circuit is that the fully enabled controlled switch array allows a large amount of current to flow to the crystal oscillator, quickly starting the oscillation at startup. Once the control circuit of the amplitude detector and control logic detects this quickly growing amplitude, the transistor $M_S$ is disabled. The combination of the small value resistor in series with the transistor $M_S$ is disabled and afterwards only allowing a reduced current to flow to the crystal oscillator thereby preventing the crystal T1 from being overdriven and destroyed.

When $V_{OUTC}$ 10-4 changes to a "1," this signal is applied to the P-channel of the transmission gate SW (although not illustrated, a "0" is applied to the N-channel of the transmission gate) which causes the transmission gate to become disabled isolating the amplitude detector from the oscillator. The current innovation which further minimizes 1/f noise is shown in FIG. 12. Also when $V_{OUTC}$ equals to a "1," the bias voltage in FIG. 11 is disabled causing the amplitude detector 11-2, the amplitude detector 11-5 and the Control Logic 11-4 to power down. The amplitude detector block is powered down by disabling the bias voltage being applied to the amplitude detector 11-2. Thus, in FIG. 12, the monitoring system of the transistor $M_S$, the amplitude detector 11-2 and the control logic 11-4 are completely disconnected and removed from the crystal oscillator. Thus, any 1/f from the transistor $M_S$ and any of the transistors in both the amplitude detector and control logic is eliminated from the oscillator decreasing the overall 1/f noise. In addition, the transistor $M_S$ is disabled causing the $R_S$ resistor to be disconnected from the power supply path of the crystal oscillator in FIG. 12. Note that once $M_S$ is disabled, the large value resistor $R_L$, is used to control and limit the inverter bias current to the inverter 7-2 instead of using PMOS current source (as in FIG. 7). Since resistors do not generate 1/f noise and only resistors are used in bias control, the 1/f noise is again further minimized. Thus, the transistor $M_S$, and the amplitude detector 11-2 and control logic are disconnected from the crystal oscillator eliminating any of the 1/f noise that these components can introduce into the crystal oscillator.

Figure 13:
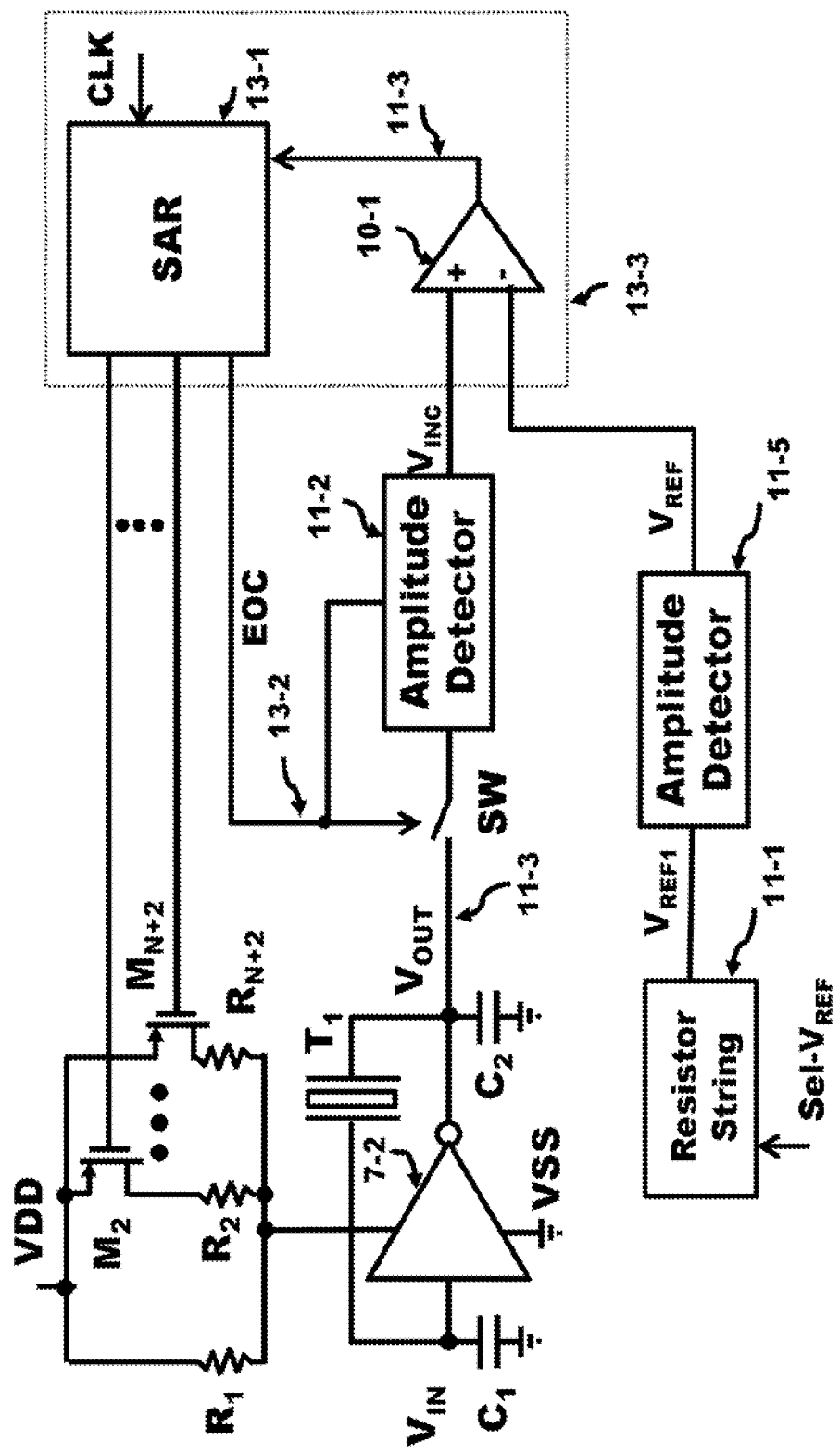
FIG. 13 illustrates an integrated successive approximation ADC into the control of the crystal oscillator in accordance with the present invention.

In FIG. 13, another innovative embodiment of the invention is illustrated. The network that applies power to the inverter 7-2 in the oscillator that generates the output $V_{OUTC}$ 11-3 consists of a controlled switch array comprising a parallel combination of resistances $R_1$, $R_2$ in series with the P-channels $M_2$, and $R_{N+2}$ in series with $M_{N+2}$. The PMOS devices are currently in the enabled state with their gate voltage at zero voltage provided by the output of the successive approximate register SAR 13-1. Since all of the PMOS devices are enabled, the full current is applied to the inverter 7-2 by the network of the controlled switch array thereby giving maximum power to the crystal $T_1$. This causes the oscillation of $V_{OUT}$ 11-3 to increase in magnitude quickly. The transmission gate SW being enabled by the SAR output EOC 13-2 being zero applies the oscillatory signal to the input of the amplitude detector 11-2 which generates the output voltage $V_{INC}$. Simultaneously, the output voltage $V_{REF1}$ of the resistor string 11-1 is applied to the amplitude detector 11-5 once the user selects the resistive tap by applying the SEL-$V_{REF}$ digital signal. The amplitude detector 11-2 converts the oscillatory signal into a rectified signal $V_{INC}$, while the amplitude detector 11-5 translates the input DC voltage $V_{REF1}$ into an output DC voltage $V_{REF}$. The two voltages, $V_{INC}$ and $V_{REF}$, are applied to the operational amplifier 10-1 which compares these voltages and generates a voltage 13-3 that is applied to the SAR 13-1. The SAR is clocked be CLK and performs a binary search for the digital value to be applied to transistors $M_2$ through $M_{N+2}$, thereby adjusting the network of the controlled switch array and supplying a reduced current to the crystal oscillator. This search is conducted until the best fit occurs at which point the SAR issues a signal EOC 13-2 to disable the transmission gate SW, isolate $V_{OUT}$ from the amplitude detector and terminate the search process. Thus, in FIG. 13, the power that is applied to the inverter 7-2 is now dependent on the enabled branches in the power supply path allowing a better power match to the crystal $T_1$. One or more of the combination of the plurality of resistors in series with their corresponding transistor may be disabled by the digital output bus of the SAR. In addition, the transistors in the enabled series combinations are in the triode mode and generate a lower 1/f noise. The combination of the comparator 10-1, the SAR 13-1 and the CLK is contained within the dotted box 13-3. The box 13-3 has attributes very similar to the control logic 11-4 of FIG. 12. The box 13-3 takes the outputs of the two amplitude detectors 11-2 and 11-5 and generates signals to reconfigure the transmission gate SW, the controlled switch array and disable the circuits which are no longer required.

Finally, it is understood that the above descriptions are only illustrative of the principle of the current invention. Various alterations, improvements, and modifications will occur and are intended to be suggested hereby, and are within the spirit and scope of the invention. This invention may, however, be embodied in many different forms and should not be construed as limited to the embodiments set forth herein. Rather, these embodiments are provided so that the disclosure will be thorough and complete, and will fully convey the scope of the invention to those skilled in the arts. It is understood that the various embodiments of the invention, although different, are not mutually exclusive. In accordance with these principles, those skilled in the art may devise numerous modifications without departing from the spirit and scope of the invention. For example, the circuits have a Doctrine of Equivalents, that is, P-channels transformed into N-channels, VDD interchanges with VSS, voltages measured with respect to the other power supply, the position of current sources moved to the other power supply, etc. The semiconductor die can include silicon, germanium, SI graphite, GaAs, SIO, etc. Although the circuits were described using CMOS, the same circuit techniques can be applied to depletion mode transistors and BJT or biploar circuits, since this technology allows the formation of current sources and source followers. When a transistor is specified, the transistor can be a transistor such as an N-MOS or P-MOS. The CMOS or SOI (Silicon on Insulator) technology provides two enhancement mode channel types: N-MOS (N-channel) and P-MOS (P-channel) transistors or transistors. In addition, a network and a portable system can exchange information wirelessly by using communication techniques such as Time Division Multiple Access (TDMA), Frequency Division Multiple Access (FDMA), Code Division Multiple Access (CDMA), Orthogonal Frequency Division Multiplexing (OFDM), Ultra Wide Band (UWB), Wi-Fi, WiGig, Bluetooth, etc. The network can comprise the phone network, IP (Internet protocol) network, Local Area Network (LAN), ad hoc networks, local routers and even other portable systems.

What is claimed is:

1. A crystal oscillator apparatus comprising:
a crystal oscillator powered through a controlled switch array;
an output of said crystal oscillator coupled by a transmission gate to a first amplitude detector;
a first input of a control logic coupled to an output of said first amplitude detector;
at least one output of said control logic coupled to said controlled switch array; and
said at least one output of said control logic coupled to said transmission gate.

2. The apparatus of claim 1, wherein said controlled switch array comprises:
a first resistor in parallel with a series combination of a second resistor and a transistor.

3. The apparatus of claim 1, where wherein said controlled switch array comprises:
a first resistor in parallel with at least one combination of another resistor in series with a transistor.

4. The apparatus of claim 1, wherein said crystal oscillator comprises:
a first node of a crystal coupled to an input of an inverter;
a second node of said crystal coupled to an output of said inverter;
a first capacitor coupled to said first node of said crystal;
a second capacitor coupled to said second node of said crystal; and
a power lead of said inverter coupled to said controlled switch array.

5. The apparatus of claim 1, further comprising:
an output of a resistor string coupled to an input of a second amplitude detector; and
an output of said second amplitude detector coupled to a second input of said control logic.

6. The apparatus of claim 5, further comprising:
a first digital signal that couples a tap point of said resistor string to said output of said resistor string.

7. The apparatus of claim 5, wherein
said first amplitude detector and said second amplitude detector are substantially similar in configuration and dimensions.

8. An apparatus comprising:
a crystal oscillator powered through a controlled switch array;
an output of said crystal oscillator coupled by a transmission gate to a first amplitude detector;
a first input of a comparator coupled to an output of said first amplitude detector;
an output of said comparator coupled to a successive approximation register (SAR); and
a plurality of digital outputs of said SAR coupled to said controlled switch array.

9. The apparatus of claim 8, further comprising:
at least one output of said SAR coupled to a gate of said transmission gate.

10. The apparatus of claim 8, wherein said controlled switch array comprises:
a first resistor in parallel with at least one combination of another resistor in series with a transistor.

11. The apparatus of claim 8, wherein said crystal oscillator comprises:
a first node of a crystal coupled to an input of an inverter;
a second node of said crystal coupled to an output of said inverter;
a first capacitor coupled to said first node of said crystal;
a second capacitor coupled to said second node of said crystal; and
a power lead of said inverter coupled to said controlled switch array.

12. The apparatus of claim 8, further comprising:
an output of a resistor string coupled to an input of a second amplitude detector; and
an output of said second amplitude detector coupled to a second input of said comparator.

13. The apparatus of claim 12, further comprising:
a first digital signal that couples a tap point of said resistor string to said output of said resistor string.

14. The apparatus of claim 12, wherein
said first amplitude detector and said second amplitude detector are substantially similar in configuration and dimensions.

15. A method of minimizing 1/f noise in a crystal oscillator comprising the steps of:
powering said crystal oscillator through a controlled switch array;
forming said controlled switch array with a first resistor in parallel with at least one combination of another resistor in series with a transistor;
coupling an output of said crystal oscillator to a first amplitude detector;
coupling a first input of a control logic to an output of said first amplitude detector;
detecting when said first input of said control logic is greater than a reference voltage;
coupling at least one output of said control logic to said controlled switch array;
adjusting network of said controlled switch array;

supplying a reduced current to said crystal oscillator with said adjusted network, thereby minimizing said l/f noise in said crystal oscillator;

coupling an output of a resistor string to an input of a second amplitude detector; and generating said reference voltage at an output of said second amplitude detector.

16. The method of claim 15, further comprising the steps of:

coupling a transmission gate between said crystal oscillator and said first amplitude detector;

disabling said transmission gate with an output of said control logic; and isolating first amplitude detector from said output of crystal oscillator.

17. The method of claim 15, wherein said first amplitude detector and said second amplitude detector are substantially similar in configuration and dimensions.

18. The method of claim 15, further comprising the steps of:

selecting a tap point voltage of said resistor string.

* * * * *